United States Patent
Yamamura

(10) Patent No.: US 10,110,207 B2
(45) Date of Patent: Oct. 23, 2018

(54) SEMICONDUCTOR DEVICE AND CONTROL METHOD THEREOF

(71) Applicant: FUJI ELECTRIC CO., LTD., Kawasaki-shi (JP)

(72) Inventor: Takuo Yamamura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/942,842

(22) Filed: Nov. 16, 2015

(65) Prior Publication Data

US 2016/0191047 A1    Jun. 30, 2016

(30) Foreign Application Priority Data

Dec. 26, 2014    (JP) ................................ 2014-264113

(51) Int. Cl.
*H03K 5/13*    (2014.01)
*H03K 17/16*    (2006.01)
*H03K 5/00*    (2006.01)

(52) U.S. Cl.
CPC ............. *H03K 5/13* (2013.01); *H03K 17/163* (2013.01); *H03K 17/168* (2013.01); *H03K 2005/00078* (2013.01)

(58) Field of Classification Search
CPC ............. H03K 17/00; H03K 17/04126; H03K 17/063; H03K 17/0826; H03K 17/163; H03K 17/168; H03K 17/567; H03K 17/601; H03K 17/6872; H03K 2005/00; H03K 2005/00078; H03K 2217/00; H03K 2217/0036; H03K 5/00; H03K 5/13

USPC ......................................................... 327/109
See application file for complete search history.

(56) References Cited

U.S. PATENT DOCUMENTS 6,333,665 B1    12/2001  Ichikawa
2009/0057832 A1    3/2009  Kouno
2009/0058499 A1*   3/2009  Yamashiro ........... H03K 17/168
                                                        327/432

(Continued)

FOREIGN PATENT DOCUMENTS

JP    2000-253646 A    9/2000
JP    2007-208831 A    8/2007
JP    2008-072848 A    3/2008

(Continued)

*Primary Examiner* — Lincoln Donovan
*Assistant Examiner* — David Mattison
(74) *Attorney, Agent, or Firm* — Rabin & Berdo, P.C.

(57) ABSTRACT

A semiconductor device for driving a semiconductor switch, including a first transistor configured to extract gate charges of the semiconductor switch with a first extraction force, a comparator configured to compare gate voltage of the semiconductor switch with a threshold voltage to thereby output a first decision signal, an AND circuit configured to perform an AND operation on a gate voltage of the first transistor and the first decision signal to thereby output a second decision signal, a delay circuit configured to delay the second decision signal by a predetermined time and to output the delayed signal as a second control signal, and a second transistor configured to be turned-on, in response to the second control signal, the predetermined time after the first transistor is turned-on, to thereby extract the gate charges of the semiconductor switch with a second extraction force larger than the first extraction force.

15 Claims, 7 Drawing Sheets

(56) References Cited

U.S. PATENT DOCUMENTS

2013/0214822 A1* 8/2013 Sakata ................ H03K 17/223
327/109

FOREIGN PATENT DOCUMENTS

| JP | 2009-055696 A | 3/2009 | | |
|----|---------------|--------|---|---|
| JP | 2009-268336 A | 11/2009 | | |
| JP | 2012-227825 | * 11/2012 | ........... | H03K 17/687 |
| JP | 2012-227825 A | 11/2012 | | |
| JP | 2012-244215 A | 12/2012 | | |

* cited by examiner

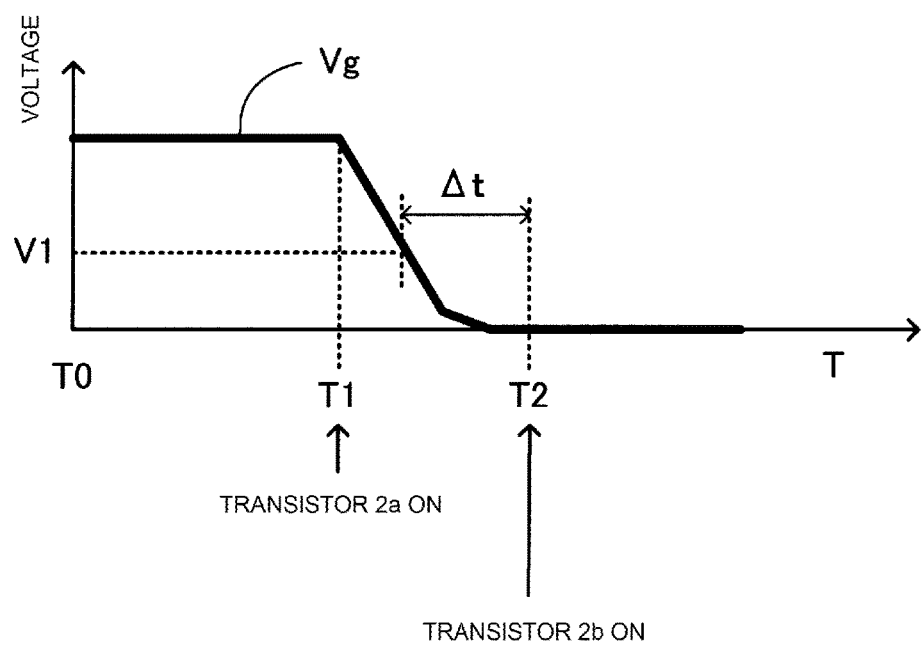

SEMICONDUCTOR DEVICE AND CONTROL METHOD THEREOF

CROSS-REFERENCE TO RELATED APPLICATIONS

This application claims the priority, under 35 U.S.C. 119, of corresponding Japanese Patent Application No. JP PA 2014-264113, filed Dec. 26, 2014, the entire content of which is hereby incorporated by reference.

BACKGROUND OF THE INVENTION

1. Field of the Invention

The present invention relates to a semiconductor device and the control method thereof.

2. Background Art

In recent years, the development of a semiconductor device called as an IPM (Intelligent Power Modules) has been proceeding which contains an IGBT (Insulated Gate Bipolar Transistors) and a driving circuit for driving the IGBT.

An IPM is a module for carrying out electric power conversion, which is widely used for applications such as an AC (Alternating current) servo, an air-conditioning device and an elevator.

As a related technology of an IPM, a technology is proposed by which an element for causing a time delay in a control voltage is disposed in the transmission path of the control voltage that drives an IGBT and, on the basis of the delayed control signal, a gate discharging transistor is made turned-off when the IGBT is turned-on and the gate discharging transistor is made turned-on when the IGBT is turned-off.

Moreover, a technology is proposed by which in making a semiconductor element turned-off, with a first MOSFET (Metal Oxide Semiconductor Field Effect Transistor) being made turned-off, a second and third MOSFETs with their respective on-state resistances different from each other are made turned-on.

In an IGBT with a fast switching speed, a voltage surge is produced at the turning-off thereof. A voltage surge with the maximum value thereof exceeding the maximum rated voltage of an IGBT might cause insulation breakdown. Therefore, it is important to suppress the increase in a voltage surge.

For turning-off an IGBT, the gate charges in the IGBT is to be extracted to lower the gate voltage. However, a strong gate charge extraction capability will result in a sudden increase in a voltage surge. Therefore, from the viewpoint of reducing the increase in a voltage surge, it is desirable to weaken a gate charge extraction capability.

However, a weak gate charge extraction capability causes difficulty in maintaining a gate voltage at a voltage sufficiently low for making an IGBT turned-off. Such a state is easily affected by noises, which causes a possible malfunction of turning-on the IGBT by a gate voltage increased by noises. Thus, from the viewpoint of inhibiting the malfunction of the IGBT, the gate charge extraction capability is to be made strong.

In this way, in a related IPM, there are problems in that strengthened gate charge extraction capability of turning-off an IGBT causes an increase in a voltage surge and gate charge extraction capability inversely weakened for avoiding an increase in such a voltage surge causes a malfunction of turning-on the IGBT that is to be turned-off. Therefore, a high performance IPM is desired for being provided in which the foregoing problems are solved for improved characteristics.

The invention was made by taking the foregoing points into consideration, and provides a semiconductor device in which an increase in a voltage surge is suppressed and a malfunction of the device is inhibited and the control method of the device.

BRIEF SUMMARY OF THE INVENTION

For solving the foregoing problems, a semiconductor device is provided in one proposal. The semiconductor device is provided with a semiconductor switch and a driving circuit carrying out the driving control of the semiconductor switch. The driving circuit includes a first transistor, a second transistor, a comparator, an AND circuit and a delay circuit. The first transistor is connected to the gate of the semiconductor switch with the output side thereof and is made to be turned-on at the turning-off of the semiconductor switch on the basis of a first control signal to extract the gate charges of the semiconductor switch with a first extraction force. The comparator has one of inputs connected to the gate of the transistor switch and compares the gate voltage of the semiconductor switch with a threshold voltage level and, when it is decided that the gate voltage is lowered down to the threshold voltage level, outputs a first decision signal. The AND circuit has one of two inputs connected to the gate of the first transistor and the other one of the inputs connected to the output side of the comparator to have the gate voltage of the first transistor and the first decision signal inputted thereto and outputs a second decision signal as the output thereof. The delay circuit is connected to the output side of the AND circuit, delays the second decision signal by a specified time and outputs the delayed signal as a second control signal. The second transistor is connected to the output side of the delay circuit with the gate thereof and to the gate of the semiconductor switch with the output side thereof and is made to be turned-on on the basis of the second control signal the specified time after the first transistor is made to be turned-on to extract the gate charges of the semiconductor switch with a second extraction force larger than the first extraction force.

In another proposal, a semiconductor device forming a driving circuit for driving a semiconductor switch is provided. The driving circuit is provided with a first transistor, a second transistor, a comparator, an AND circuit and a delay circuit. The first transistor is connected to the gate of the semiconductor switch with the output side thereof and is made to be turned-on at the turning-off of the semiconductor switch on the basis of a first control signal to extract the gate charges of the semiconductor switch with a first extraction force. The comparator has one of inputs connected to the gate of the transistor switch and compares the gate voltage of the semiconductor switch with a threshold voltage level and, when it is decided that the gate voltage is lowered down to the threshold voltage level, outputs a first decision signal. The AND circuit has one of two inputs connected to the gate of the first transistor and the other one of the inputs connected to the output side of the comparator to have the gate voltage of the first transistor and the first decision signal inputted thereto and outputs a second decision signal as the output thereof. The delay circuit is connected to the output side of the AND circuit, delays the second decision signal by a specified time and outputs the delayed signal as a second control signal. The second transistor is connected to the output side of the delay circuit with the gate thereof and to the gate of the semiconductor switch with the output side thereof and is made to be turned-on on the basis of the second control signal the specified time after the first transistor is made to be turned-on to extract the gate charges of the semiconductor switch with a second extraction force larger than the first extraction force.

Each of the semiconductor devices according to the foregoing proposals can be formed as follows.

Namely, the delay circuit may have a time delay being set so that the second rate of change in the collector current of the semiconductor switch when the second transistor is made to be turned-on by the second control signal is smaller than the first rate of change in the collector current of the semiconductor switch when the second transistor is made to be turned-on by the second decision signal.

Moreover, the delay circuit may be formed so as to make the second decision signal delayed from the time at which the gate voltage is lowered down to the threshold voltage level to the time from which the gate voltage initiates to maintain the voltage at the level of the ground.

Furthermore, the delay circuit may be formed so as to make the second decision signal delayed from the time at which the gate voltage is lowered down to the threshold voltage level to the time from which the collector current in the semiconductor switch comes to be maintained at zero.

In addition, the delay circuit may be formed so as to make the second decision signal delayed from the time at which the gate voltage is lowered down to the threshold voltage level to the time after the peak of the voltage surge produced in the semiconductor switch.

In further another proposal, a control method of a semiconductor device for controlling the gate voltage of a semiconductor switch is provided. The semiconductor device includes a first transistor connected to the gate of the semiconductor switch with the output side thereof, a comparator having one of inputs connected to the gate of the transistor switch, an AND circuit having one of two inputs connected to the gate of the first transistor and the other one of the inputs connected to the output side of the comparator, a delay circuit having the input side thereof connected to the output side of the AND circuit, and a second transistor connected to the output side of the delay circuit with the gate thereof and to the gate of the semiconductor switch with the output side thereof. The control method thus includes the steps of:

turning-on the first transistor at the turning-off of the semiconductor switch on the basis of a first control signal to extract the gate charges of the semiconductor switch with a first extraction force of the first transistor;

comparing the gate voltage of the semiconductor switch with a threshold voltage level by the comparator and, when the comparator decides that the gate voltage is lowered down to the threshold voltage level, making the comparator output a first decision signal therefrom;

carrying out an AND operation by the AND circuit with the gate voltage of the first transistor and the first decision signal inputted thereto and making the AND circuit output a second decision signal as the output thereof;

delaying the second decision signal by a specified time by the delay circuit and making the delay circuit output the delayed signal therefrom as a second control signal; and turning-on the second transistor on the basis of the second control signal the specified time after the first transistor is made to be turned-on to extract the gate charges of the semiconductor switch with a second extraction force of the second transistor larger than the first extraction force.

In still another proposal, a gate voltage control method for controlling the gate voltage of a semiconductor switch is provided. The method includes the steps of:

carrying out an operation of extracting the gate charges of the semiconductor switch with a first extraction force by a first transistor for being made to be turned-on at the turning-off of the semiconductor switch on the basis of a first control signal;

comparing the gate voltage of the semiconductor switch with a threshold voltage level by a comparator when the gate voltage of a semiconductor switch is inputted and, when it is decided that the gate voltage is lowered down to the threshold voltage level, making the comparator output a first decision signal;

carrying out an AND operation by an AND circuit with the gate voltage of the first transistor and the first decision signal when the gate voltage is inputted to the AND circuit and outputting a second decision signal as the output thereof;

outputting a second control signal to which the second decision signal is delayed by a specified time by a delay circuit; and extracting the gate charges of the semiconductor switch with a second extraction force larger than the first extraction force by a second transistor being made to be turned-on after the first transistor is made to be turned-on on the basis of the second control signal.

By the foregoing proposals, it becomes possible to provide a semiconductor device in which an increase in a voltage surge is suppressed and a malfunction of the device is inhibited and the control method of the device.

BRIEF DESCRIPTION OF THE DRAWINGS

FIGS. 1A and 1B are views showing an example of the configuration of a semiconductor device according to an embodiment of the invention together with an example of the operating status thereof with FIG. 1A showing the example of the configuration of the semiconductor device and FIG. 1B showing the operating status thereof;

DETAILED DESCRIPTION OF THE INVENTION

Figure 1A:
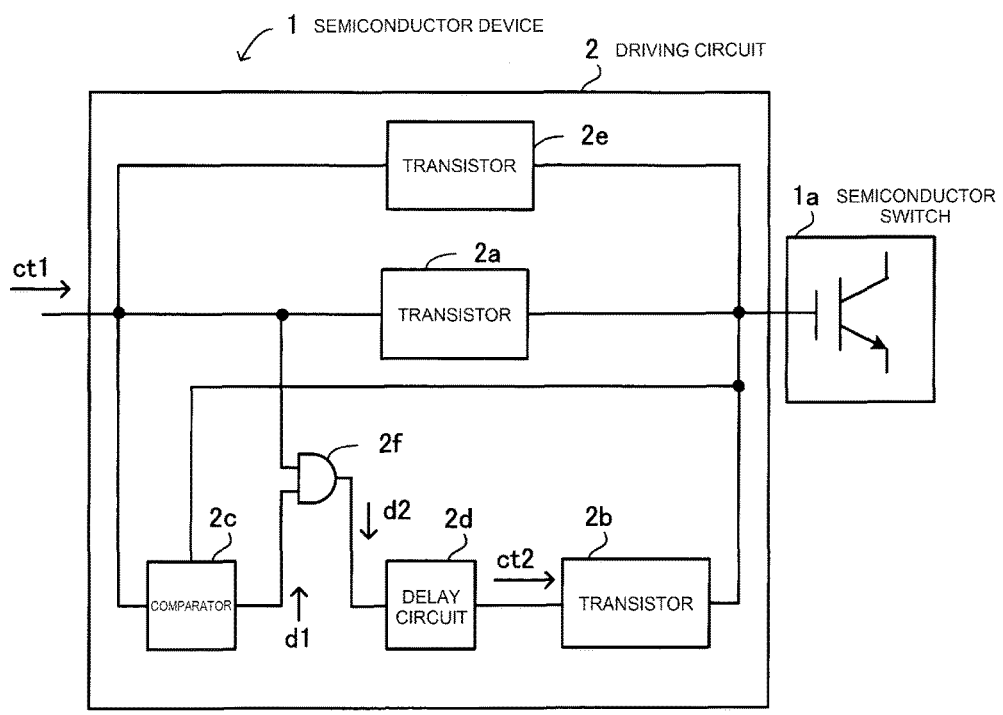

In the following, an embodiment according to the invention will be explained with reference to attached drawings. In the specification and the attached drawings, components having substantially the same functions will be denoted with the same reference numerals and signs, by which redundant explanations thereof will be sometimes omitted.

Embodiment

FIGS. 1A and 1B are views showing an example of the configuration of a semiconductor device according to an embodiment of the invention together with an example of the operating status thereof with FIG. 1A showing the example of the configuration of the semiconductor device and FIG. 1B showing the operating status thereof.

The semiconductor device 1 is provided with a semiconductor switch 1a and a driving circuit 2. The driving circuit 2 includes a transistor (first transistor) 2a, a transistor (second transistor) 2b, a comparator 2c, a delay circuit 2d, a transistor 2e and an AND circuit 2f.

The transistor 2a is turned-on at the turning-off of the semiconductor switch 1a on the basis of a control signal (first control signal) ct1 to extract charges stored in the gate of the semiconductor switch 1a by a first extraction force. The transistor 2e is turned-on at the turning-on of the semiconductor switch 1a on the basis of the control signal (first control signal) ct1 to store charges in the gate of the semiconductor switch 1a and produce the gate voltage thereof.

The comparator 2c carries out comparison between the gate voltage of the semiconductor switch 1a and a predetermined threshold voltage level. When it is decided that the gate voltage lowers down to the threshold voltage level, a decision signal d1 is outputted.

The AND circuit 2f carries out an operation of the logical product of the control signal ct1 and the decision signal d1 to output a decision signal d2.

The delay circuit 2d makes the decision signal d2 delayed by a specified time to output the delayed decision signal d2 as a control signal (second control signal) ct2.

The transistor 2b, on the basis of the control signal ct2, is turned-on after the transistor 2a is turned-on to extract gate charges of the semiconductor switch 1a by a second extraction force larger than the first extraction force.

Here, the waveform presented in FIG. 1B shows the transition of the gate voltage Vg of the semiconductor switch 1a. In FIG. 1B, the vertical axis represents a voltage and the horizontal axis represents a time T. Within a range where the time T is T0≤T≤T1, the gate voltage Vg is at an H (high) level by which the semiconductor switch 1a is in a state of being turned-on.

At the time T1, the semiconductor switch 1a initiates turning-off. In this case, the transistor 2a is first made to be turned-on at the time T1 on the basis of the control signal ct1. By the first extraction force of the transistor 2a brought into the turned-on state, gate charges are extracted from the gate of the semiconductor switch 1a in a state at the gate voltage Vg.

The comparator 2c outputs the decision signal d1 when the gate voltage Vg lowers down to the threshold voltage level V1. The AND circuit 2f carries out the operation of the logical product of the control signal ct1 and the decision signal d1 to output the decision signal d2. The delay circuit 2d delays the decision signal d2 and outputs the delayed decision signal d2 as the control signal ct2.

At this time, in the delay circuit 2d, the control signal ct2 is to be outputted to the transistor 2b after a delay with a time Δt from the time at which the gate voltage Vg lowers down to the threshold voltage level V1. The delay time Δt is, for example, equivalent to the time from the time at which the gate voltage Vg reaches the threshold voltage level V1 to the time from which the gate voltage Vg comes to keep the GND (ground) level.

The transistor 2b, when having the control signal ct2 applied thereto at the time T2, extracts the gate charges of the semiconductor switch 1a by the second extraction force larger than the first extraction force.

In this way, the semiconductor device 1, at the turning-off of the semiconductor switch 1a, extracts the gate charges of the semiconductor switch 1a by the first extraction force to thereby lower the gate voltage Vg of the semiconductor switch 1a down to the threshold voltage level V1. Then, after a delay of a specified time, the semiconductor device 1 extracts the gate charges of the semiconductor switch 1a by the second extraction force larger than the first extraction force.

This avoids necessity for considering a tradeoff between suppression of an increase in a voltage surge in the semiconductor switch 1a and inhibition of the occurrence of a malfunction in the semiconductor switch 1a with respect to the gate charge extraction capability for turning-off the semiconductor switch 1a, which can improve the switching characteristic of the device.

Therefore, it becomes possible to suppress an increase in a voltage surge occurred at the turning-off of the semiconductor switch 1a and inhibit the malfunction of the semiconductor switch 1a.

(Configuration of an IPM Including No Delay Circuit)

In the next, the case in which the semiconductor device 1 according to the invention is applied to an IPM will be explained in detail for each design step. First, the configuration of an IPM will be explained which includes no delay circuit 2d as one of the components of the technology according to the invention. In the following explanations, an extraction force will be referred to as a gate charge extraction capability. As a result of the gate charge extraction, the gate voltage is to be lowered.

Figure 2:
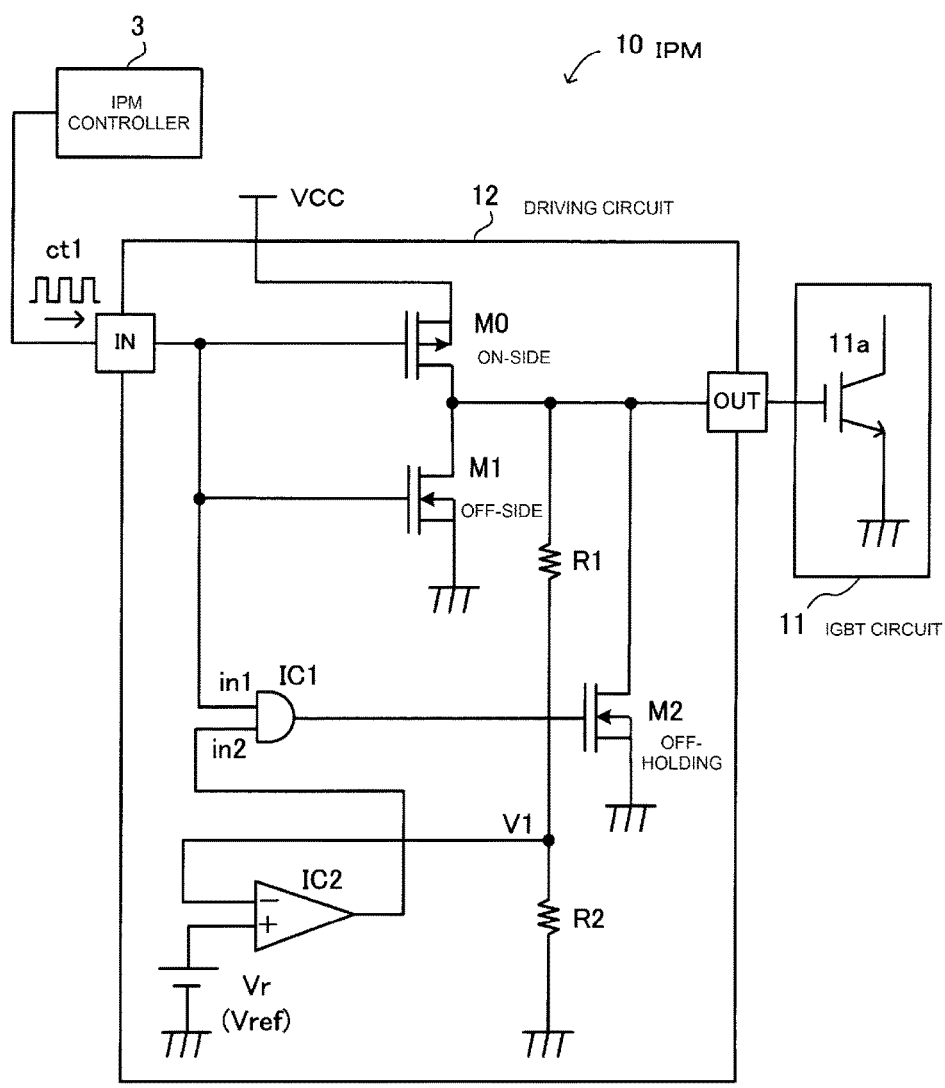
FIG. 2 is a diagram showing an example of the configuration of a related IPM.

FIG. 2 is a diagram showing an example of the configuration of a related IPM. Although the IPM has an upper and lower arms, FIG. 2 shows only the lower arm. The omitted upper arm has a configuration the same as that of the lower arm.

In FIG. 2, an IPM 10 is provided with an IGBT circuit 11, a driving circuit 12 and an IPM controller 3. The IGBT circuit 11 includes an IGBT 11a.

Moreover, the driving circuit 12 includes transistors M0, M1 and M2, an AND element IC1, a comparator IC2, a reference voltage source Vr and resistors R1 and R2. Here, an example is shown in which a p-channel transistor is used for the transistor M0 and n-channel transistors are used for the transistors M1 and M2.

The IGBT circuit 11 converts a DC (direct current) high voltage (600V, for example) to an AC voltage to supply the AC voltage to a load. The IGBT circuit 11 corresponds to a main circuit section such as a three-phase inverter. The driving circuit 12 carries out driving control of the IGBT circuit 11. The IPM controller 3 provides a driving instruction of the IGBT circuit 11 to the driving circuit 12.

The connections among the components will be explained. To an input terminal IN of the driving circuit 12, the IPM controller 3 is connected. In addition, to the input terminal IN, the gates of the transistors M0 and M1 and an input terminal in1 of the AND element IC1 are connected.

The source of the transistor M0 is connected to a power supply voltage VCC and the source of the transistor M1 is connected to the ground GND. The power supply voltage VCC is the operating voltage of the driving circuit 12, which is, for example, 15V.

The drain of the transistor M0 is connected to the drain of the transistor M1, one end of a resistor R1, the drain of the transistor M2 and an output terminal OUT. To the output terminal OUT, the gate of the IGBT 11a in the IGBT circuit 11 is connected.

The other end of the resistor R1 is connected to an inverting input terminal (−) of the comparator IC2 and one end of the resistor R2. The other end of the resistor R2 is connected to the ground GND.

The output terminal of the AND element IC1 is connected to the gate of the transistor M2 and the source of the transistor M2 is connected to the ground GND. The output terminal of the comparator IC2 is connected to an input terminal in2 of the AND element IC1 and a non-inverting input terminal (+) of the comparator IC2 is connected to the positive terminal of the reference voltage source Vr. The negative terminal of the reference voltage source Vr is connected to the ground GND.

The collector of the IGBT 11a is connected to an opposite arm and the emitter of the IGBT 11a is connected to the ground GND. The opposite arm corresponds to an IGBT not shown which is in cascade connection to the IGBT 11a. In this case, the collector of the IGBT 11a is to be connected onto the emitter side of the IGBT in the opposite arm.

(Operation of the IPM)

The operation of the IPM will be explained. In the transistors M0 to M2 in the driving circuit 12, the transistor M0 is a gate voltage controlling element for turning-on the IGBT 11a for which element a PMOS (p-channel MOSFET) is used. The transistors M1 and M2 are gate voltage controlling elements for turning-off the IGBT 11a. For each the transistors M1 and M2, an NMOS (n-channel MOSFET) is used.

The gate charge extraction capability of the transistor M1 is weaker than the gate charge extraction capability of the transistor M2. In reverse, the gate charge extraction capability of the transistor M2 is stronger than the gate charge extraction capability of the transistor M1.

A gate charge extraction capability corresponds to an amount of a drain current flowing in an MOS transistor, for example. It can be said that the larger the maximum drain current becomes, the higher the gate charge extraction capability becomes.

In the following explanation, the transistor M0 will be referred to as the on-side transistor M0, the transistor M1 will be referred to as the off-side transistor M1 and the transistor M2 will be referred to as the off-holding transistor M2. Moreover, a reference voltage produced by the reference voltage source Vr is designated as Vref. The reference voltage Vref is a threshold voltage, which is made to be, for example, 2V.

The IPM controller 3 transmits a control signal (PWM (Pulse Width Modulation) signal) ct1, which signal is in a pulsed waveform alternately repeating an H (high) level state and an L (low) level state, to the driving circuit 12. The driving circuit 12 receives the control signal ct1 through the input terminal IN.

When the control signal ct1 is at the L-level, the on-side transistor M0 of a p-channel MOSFET is turned-on and the off-side transistor M1 and off-holding transistor M2, both being n-channel MOSFETs, are turned-off.

Therefore, by the turning-on of the on-side transistor M0, the power supply voltage VCC is applied to the gate of the IGBT 11a, by which the IGBT 11a is made to be turned-on.

When the control signal ct1 is at the H-level, the on-side transistor M0 is turned-off and the off-side transistor M1 and off-holding transistor M2 are turned-on. At this time, as will be explained later, after the off-side transistor M1 is turned-on, the off-holding transistor M2 is to be turned-on with a certain time difference.

First, the control signal ct1 at the H-level is applied to the gate of the off-side transistor M1, which is therefore turned-on.

While, to the inverting input terminal (−) of the comparator IC2, a voltage V1 is inputted. The voltage V1 is a voltage provided by dividing the drain voltage of the off-side transistor M1 with the resistors R1 and R2. In the comparator IC2, the voltage V1 and the reference voltage Vref produced by the reference voltage source Vr are compared.

Here, the voltage V1, which is provided by dividing the drain voltage of the off-side transistor M1 with the resistors R1 and R2, is inputted to the comparator IC2. This is done by considering the breakdown voltage of the comparator IC2. When the comparator IC2 has the breakdown voltage up to 15V as an operating voltage of the driving circuit 12, it is not exceptionally necessary to divide the drain voltage of the off-side transistor M1 with resistors.

When the voltage V1 exceeds the reference voltage Vref (Vref<V1), the comparator IC2 outputs a signal at the L-level. When the voltage V1 is equal to or less than the reference voltage Vref (V1≤Vref), the comparator IC2 outputs a signal at the H-level.

Immediately after the off-side transistor M1 is turned-on, the voltage V1 is higher than the reference voltage Vref (Vref<V1). Thus, a signal at the L-level is inputted to the input terminal in2 of the AND element IC1.

In addition, the turning-on of the off-side transistor M1 causes the drain voltage of the off-side transistor M1 to slowly lower. At this time, the voltage V1 reaching the reference voltage Vref makes the level of the output of the comparator IC2 become at the H-level, by which a signal at the H-level is to be inputted to the input terminal in2 of the AND element IC1.

Therefore, the voltage V1 slowly lowered to be equal to or less than the reference voltage Vref (V1≤Vref) brings the level at the input terminal in2 of the AND element IC1 to become the H-level. At this time, to the input terminal in1 of the AND element IC1, a signal at the H-level is inputted. Thus, the output of the AND element IC1 becomes a signal at the H-level (equivalent to the decision signal d2), by which the off-holding transistor M2 is to be turned-on.

In this way, the driving circuit 12 is provided to have the following configuration. That is, when making the IGBT 11a turn-on, the off-side transistor M1 with a weak gate charge extraction capability is first made to be turned-on. Then, the drain voltage of the off-side transistor M1, i.e. the gate voltage of the IGBT 11a lowered down to the threshold voltage makes the off-holding transistor M2 turned-on which has the strong gate charge extraction capability.

(Operations of the Off-Side Transistor and Off-Holding Transistor)

As was explained in the foregoing, in the IPM 10, two of the off-side transistor M1 and off-holding transistor M2 are used for turning-off the IGBT 11a with the gate charge extraction capability of the off-side transistor M1 made to be weak and the gate charge extraction capability of the off-holding transistor M2 made to be strong.

The turning-on of the off-side transistor M1 with a weak gate charge extraction capability is carried out for suppressing the rising in a voltage surge at the turning-off of the IGBT 11a. Furthermore, for inhibiting the malfunction of the IGBT 11a, the off-holding transistor M2 with a strong gate charge extraction capability is to be turned-on.

Here, at the turning-off of the IGBT 11a, a voltage surge is produced with the value thereof depending on the rate of change in the corrector current (hereinafter also referred to as "di/dt") of the IGBT 11a.

That is, as di/dt becomes larger (as the rate of change (lowering rate of change) in the corrector current of the IGBT 11a in a unit time becomes larger), the voltage surge (the peak of the voltage surge) becomes larger. In reverse, as di/dt becomes smaller, the voltage surge becomes smaller. The value of di/dt is equivalent to the inclination of a current with respect to a time.

A voltage surge can be suppressed by adjusting the gate voltage of the IGBT 11a. Thus, in the IPM 10, at the turning-off of the IGBT 11a, the off-side transistor M1 is first made to be turned-on.

Since an element with a weak gate charge extraction capability is used for the off-side transistor M1, no gate charges in the IGBT 11a are immediately extracted (the gate voltage is lowered relatively slow). This makes di/dt in the corrector current become small, so that no corrector current in the IGBT 11a is abruptly lowered in a short time.

However, the adjustment of the gate voltage of the IGBT 11a only by the off-side transistor M1 with a weak gate charge extraction capability makes it difficult to maintain the gate voltage at a low voltage level sufficient to make the IGBT 11a turned-off.

No gate voltage lowered down to a low voltage level sufficient to make the IGBT 11a turned-off causes noises to be easily superposed on the gate voltage to possibly to cause the IGBT 11a to malfunction due to noises.

Therefore, in the IPM 10, at the turning-off of the IGBT 11a, when the gate voltage of the IGBT 11a is lowered down to the threshold voltage level thereof with the off-side transistor M1 made turned-on, the off-holding transistor M2 is continuously made to be turned-on.

For the off-holding transistor M2, an element with a strong gate charge extraction capability is used. Therefore, when the gate voltage of the IGBT 11a is lowered down to the threshold voltage level thereof, the off-holding transistor M2 makes the IGBT 11a lower the gate voltage thereof down to a sufficiently low voltage level for making the IGBT 11a turned-off.

(Operation of the IGBT at Turning-Off)

The operation of the IGBT 11a in the IPM 10 at the turning-off thereof will be explained with reference to simulated waveforms.

Figure 3:
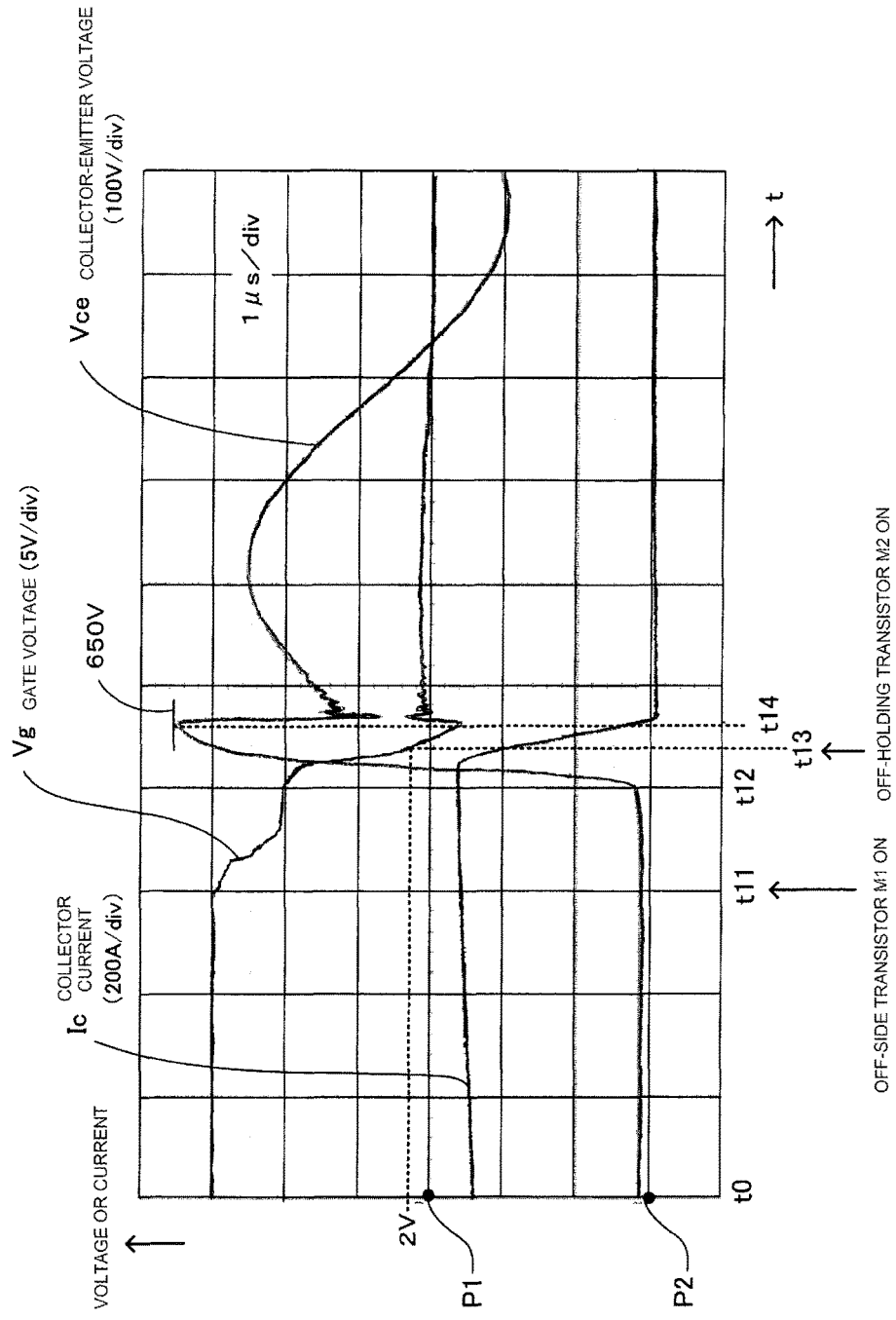
FIG. 3 is a diagram illustrating an operation of the IGBT at the turning-off thereof in the related IPM.

FIG. 3 is a diagram illustrating an operation of the IGBT 11a at the turning-off thereof in the related IPM 10. In the diagram, the vertical axis represents a voltage (V) or a current (A) and the horizontal axis represents a time t.

Three waveforms in FIG. 3 represent the gate voltage Vg of the IGBT 11a, the collector-emitter voltage Vce of the IGBT 11a and the collector current Ic of the IGBT 11a.

One division on the vertical axis is equivalent to 5V with respect to the gate voltage Vg, 100V with respect to the collector-emitter voltage Vce and 200 A with respect to the collector current Ic. One division on the horizontal axis with respect to the time t is equivalent to 1 μs.

The point P1 shows the position of the origin at which the gate voltage Vg becomes 0V. The point P2 shows the position of the origin at which the collector-emitter voltage Vce becomes 0V and further shows the position of the origin at which the collector current Ic becomes 0 A.

[t0≤t<t11] A state is shown in which the IGBT 11a is turned-on. In the state, the IGBT 11a has a voltage of 15V applied to the gate thereof and has a collector current Ic of approximately 500 A flowing in the collector thereof. In addition, the collector-emitter voltage Vce is near the voltage of the ground GND (0V).

[t=t11] This is the time to initiate the turning-off of the IGBT 11a. The off-side transistor M1 is made to be turned-on.

[t11<t<t12] The gate voltage Vg is slowly lowered. The collector current Ic and the collector-emitter voltage Vce show no remarkable change.

[t12≤t<t13] The gate voltage Vg is being lowered. The collector-emitter voltage Vce initiates an increase to be raising a voltage surge. The collector current Ic initiates lowering.

[t=t13] The gate voltage Vg is lowered from 15V down to the threshold voltage of 2V. At this time, the off-holding transistor M2 is turned-on.

[t13<t<t14] The gate voltage Vg becomes lower than 2V. The collector-emitter voltage Vce (voltage surge) continues increasing. The collector current Ic is being lowered.

[t=t14] The gate voltage Vg is lowered down to the order of −2V. The collector-emitter voltage Vce (voltage surge) has the peak thereof increased up to 650V.

[t14<t] The gate voltage Vg is near the ground GND level (0V). The collector-emitter voltage Vce (voltage surge) is lowered to decrease while repeating oscillations. The collector current Ic is at approximately 0 A.

As is shown in the foregoing, in the configuration of the IPM 10, the peak of the voltage surge becomes 650V at the time t14. At this time, observation of the gate voltage Vg tells that the gate voltage Vg largely deviates onto the negative side to produce an undershoot.

It is considered that the undershoot is produced by the too strong gate charge extraction capability of the off-holding transistor M2. In addition, the undershoot thus produced increases di/dt as the rate of change in the collector current Ic.

Therefore, it can be determined that the suppression of the production of the undershoot will be able to further lower the peak of the voltage surge. In this case, it is considerable for lowering the peak of the voltage surge to adjust the gate charge extraction capability of the off-holding transistor M2.

With the foregoing configuration, however, although the off-holding transistor M2 is operated so as to be brought into a turned-on state with a delay to the turning-on operation of the off-side transistor M1, the turning-on operation of the off-holding transistor M2 still has a strong influence on di/dt of the IGBT 11a, by which the collector-emitter voltage Vce (voltage surge) of the IGBT 11a was increased up to 650V at the peak thereof. For improving this, it is considered to change the size and the rated drain current value etc. of the off-holding transistor M2. Even with this, it is difficult to finely adjust the gate charge extraction capability of the off-holding transistor M2. In addition, it is also difficult to always select a transistor element with a gate charge extraction capability suited for the circuit configuration such as that in the foregoing.

(Operation According to the Invention)

Accordingly, in the technology according to the invention, the off-holding transistor M2 is made to have a delay in the turning-on operation thereof, by which the production of an undershoot is reliably inhibited for suppressing the peak of a voltage surge.

In the next, an IPM according to the invention will be explained in which a delay is provided for the operation of the off-holding transistor M2 for suppressing the peak of a voltage surge.

Figure 4:
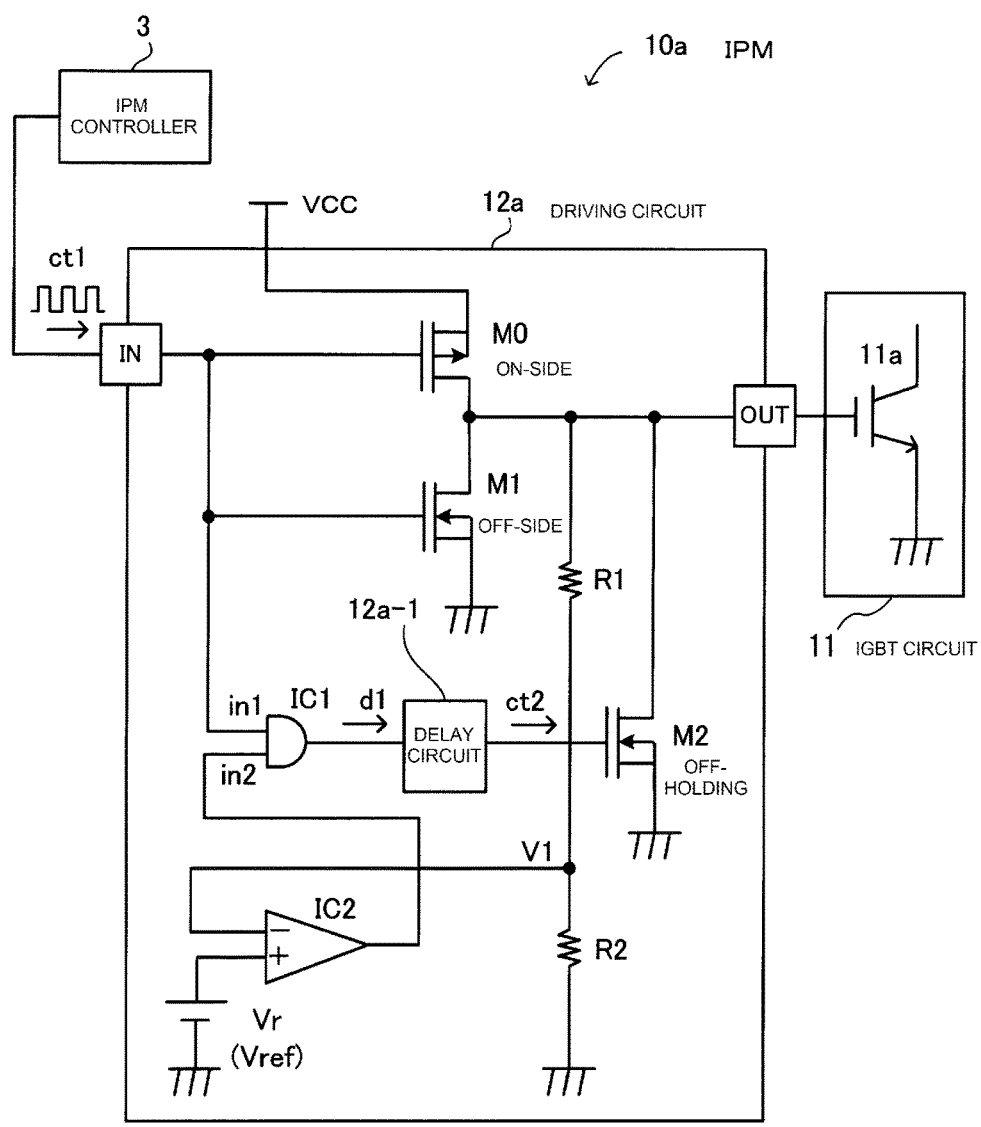
FIG. 4 is a diagram showing an example of the configuration of an IPM according to the embodiment of the invention.

FIG. 4 is a diagram showing an example of the configuration of an IPM according to the embodiment of the invention. An IPM 10a according to the embodiment of the invention is provided with an IGBT circuit 11, a driving circuit 12a and an IPM controller 3. The IGBT circuit 11 includes an IGBT 11a.

Moreover, the driving circuit 12a includes transistors M0, M1 and M2, an AND element IC1, a comparator IC2, a reference voltage source Vr, a delay circuit 12a-1 and resistors R1 and R2. The IPM 10a is provided with the delay circuit 12a-1 as a new component in the IPM 10 shown in FIG. 2 with the other configuration being the same as that in the IPM 10.

Here, the off-side transistor M1 corresponds to the transistor 2a in FIGS. 1A and 1B and the off-holding transistor M2 corresponds to the transistor 2b in FIGS. 1A and 1B. Moreover, by at least the AND element IC1 and the comparator IC2, the function of the AND circuit 2f and the comparator 2c in FIG. 1A is actualized. Further, the delay circuit 12a-1 corresponds to the delay circuit 2d in FIG. 1A.

The delay circuit 12a-1 is inserted between the output side of the AND element IC1 and the gate of the off-holding transistor M2. Namely, the input terminal of the delay circuit 12a-1 is connected to the output terminal of the AND element IC1 and the output terminal of the delay circuit 12a-1 is connected to the gate of the off-holding transistor M2. The other relations in connections are the same as those in the IPM 10.

The delay circuit 12a-1 makes the H-level signal (a decision signal d1) from the AND element IC1 delayed by a specified time to output the delayed signal as a control signal ct2 and inputs the control signal ct2 to the gate of the off-holding transistor M2.

Here, let the rate of change in the collector current Ic of the IGBT 11a when the off-holding transistor M2 is made turned-on by the decision signal d1 be a first di/dt and let the rate of change in the collector current Ic when the off-holding transistor M2 is made turned-on by the control signal ct2 be a second di/dt.

In this case, in the delay circuit 12a-1, a time delay is set so that the second di/dt becomes smaller than the first di/dt.

In this way, by reducing the rate of change in the collector current Ic of the IGBT 11a, the peak of the voltage surge produced at the turning-off of the IGBT 11a is made to be lowered. Namely, in the delay circuit 12a-1, the time delay is to be set so that no di/dt in the collector current Ic becomes large to the extent that the peak of the voltage surge exceeds a specified value at the turning-off of the IGBT 11a.

Specifically, the delay circuit 12a-1, for example, delays the decision signal d1 from the time at which the gate voltage Vg of the IGBT 11a is lowered down to the voltage V1 to the time from which the gate voltage Vg initiates to maintain the voltage at the level of the ground GND.

Namely, the delay circuit 12a-1 delays the decision signal d1 to the time from which the gate voltage Vg comes to be able to maintain the voltage around the ground GND level with stability to some extent without showing large fluctuations around the voltage of the ground GND level. Then, the delay circuit 12a-1 outputs thus delayed decision signal d1 as the control signal ct2 making the off-holding transistor M2 turned-on.

As another way, the delay circuit 12a-1 may delay the decision signal d1 from the time at which the gate voltage Vg of the IGBT 11a is lowered down to the voltage V1 to the time from which the collector current Ic flowing in the IGBT 11a comes to be maintained at 0 A.

That is, the delay circuit 12a-1 delays the decision signal d1 to the time from which the collector current Ic comes to be able to maintain the current value around 0 A with stability to some extent without showing large fluctuations around 0 A. Then, the delay circuit 12a-1 outputs thus delayed decision signal d1 as the control signal ct2 making the off-holding transistor M2 turned-on.

Furthermore, the delay circuit 12a-1 may delay the decision signal d1 from the time at which the gate voltage Vg of the IGBT 11a is lowered down to the voltage V1 to the time after the peak of the voltage surge produced in the IGBT 11a. Then, the delay circuit 12a-1 outputs thus delayed decision signal d1 as the control signal ct2 making the off-holding transistor M2 turned-on.

Figure 5:
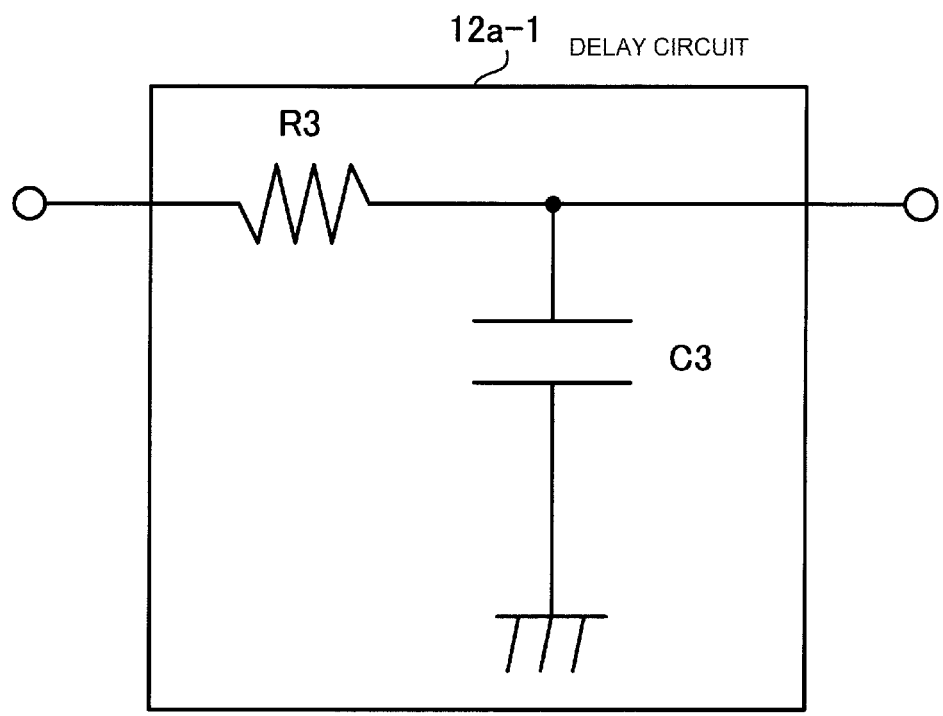
FIG. 5 is a diagram showing an example of the configuration of a delay circuit in the IPM according to the embodiment of the invention.

FIG. 5 is a diagram showing an example of the configuration of a delay circuit 12a-1 in the IPM 10a according to the embodiment of the invention. The delay circuit 12a-1 is, for example, an RC circuit including a resistor R3 and a capacitor C3.

One end of the resistor R3 is connected to the output terminal of the AND element IC1. The other end of the resistor R3 is connected to one end of the capacitor C3 and the gate of the off-holding transistor M2. The other end of the capacitor C3 is connected to the ground GND. The configuration of the delay circuit 12a-1 can be provided by such a simple circuit.

(Operation of the IGBT at Turning-Off)

The operation of the IGBT 11a in the IPM 10a according to the embodiment of the invention at the turning-off thereof will be explained with reference to simulated waveforms.

Figure 6:
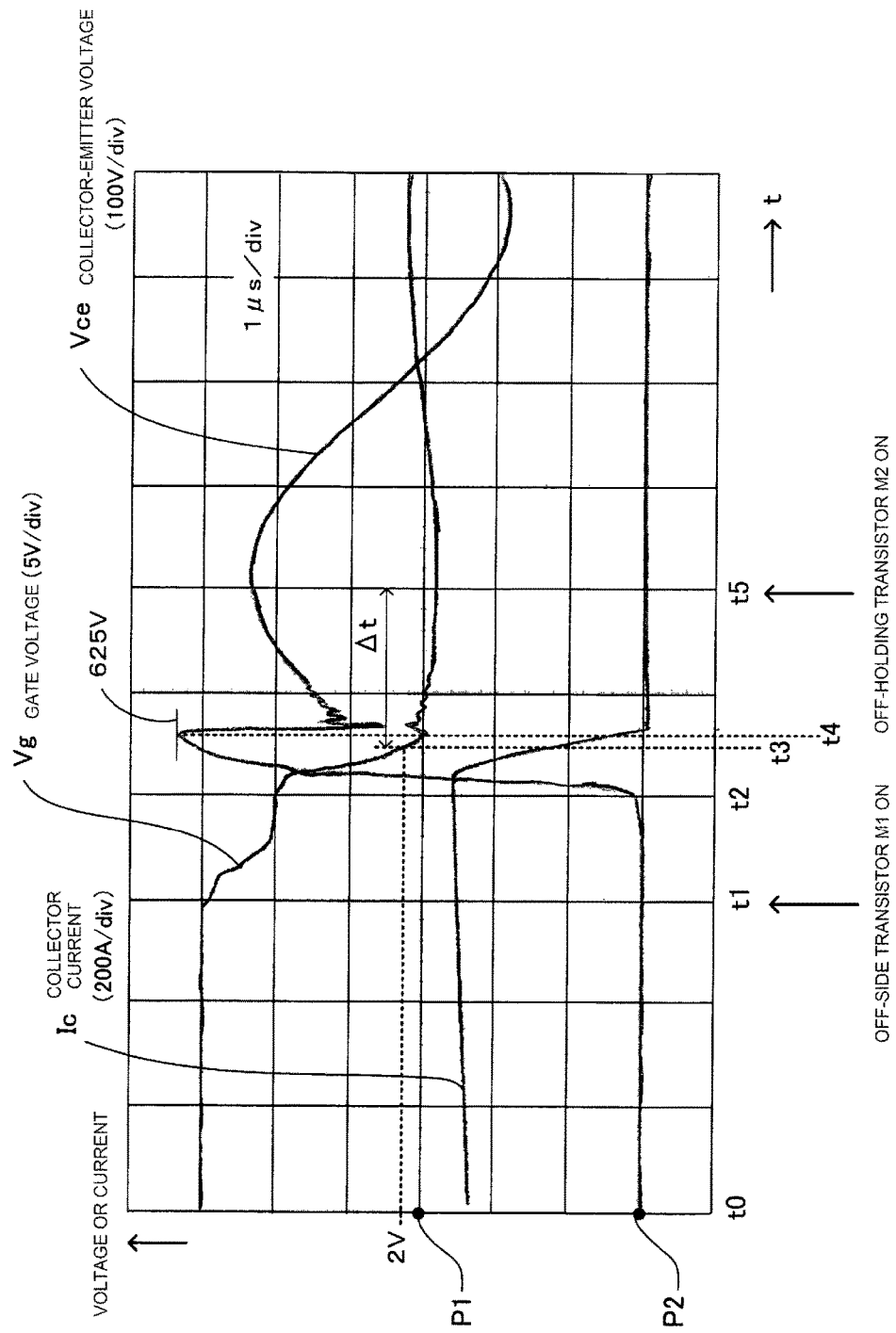
FIG. 6 is a diagram illustrating an operation of the IGBT at the turning-off thereof in the IPM according to the embodiment of the invention.

FIG. 6 is a diagram illustrating an operation of the IGBT 11a at the turning-off thereof in the IPM 10a according to the embodiment of the invention. In the diagram, the vertical axis represents a voltage (V) or a current (A) and the horizontal axis represents a time t.

Three waveforms in FIG. 6 represent the gate voltage Vg of the IGBT 11a, the collector-emitter voltage Vce of the IGBT 11a and the collector current Ic of the IGBT 11a.

One division on the vertical axis is equivalent to 5V with respect to the gate voltage Vg, 100V with respect to the collector-emitter voltage Vce and 200 A with respect to the collector current Ic. One division on the horizontal axis with respect to the time t is equivalent to 1 µs.

The point P1 shows the position of the origin at which the gate voltage Vg becomes 0V. The point P2 shows the position of the origin at which the collector-emitter voltage Vce becomes 0V and further shows the position of the origin at which the collector current Ic becomes 0 A.

[t0≤t<t1] A state is shown in which the IGBT 11a is turned-on. In the state, the IGBT 11a has a voltage of 15V applied to the gate thereof and has a collector current Ic of approximately 500 A flowing in the collector thereof. In addition, the collector-emitter voltage Vce is near the voltage of the ground GND (0V).

[t=t1] This is the time to initiate the turning-off of the IGBT 11a. The off-side transistor M1 is made to be turned-on.

[t1<t<t2] The gate voltage Vg is slowly lowered. The collector current Ic and the collector-emitter voltage Vce show no remarkable change.

[t2≤t<t3] The gate voltage Vg is being slowly lowered. The collector-emitter voltage Vce initiates an increase to be raising a voltage surge. The collector current Ic initiates lowering.

[t=t3] The gate voltage Vg is lowered from 15V down to the order of 2V.

[t3<t≤t4] The gate voltage Vg becomes lower than 2V. The collector-emitter voltage Vce (voltage surge) increases to become 625V at the peak thereof at the time t4. The collector current Ic is being lowered.

[t4<t<t5] The gate voltage Vg is lowered down to the ground GND level (0V). The collector-emitter voltage Vce (voltage surge) is lowered and the collector current Ic is at approximately 0 A.

[t=t5] The off-holding transistor M2 is turned-on at the time t5 at which a time Δt has passed from the time t4.

[t5<t] The gate voltage Vg is at approximately 0V (the ground GND level). The collector-emitter voltage Vce (voltage surge) is lowered to be decreasing while repeating oscillations. The collector current Ic is at approximately 0 A.

Here, the comparison between the voltage surge shown in FIG. 3 and that shown in FIG. 6 tells that in contrast with the peak of the voltage surge being 650V in the IPM 10, the peak of the voltage surge becomes 625V in the IPM 10*a*, a 25V decrease. In addition, the case shown in FIG. 6 tells that an undershoot is suppressed.

In the foregoing example, the output of the AND element IC1 is made to be delayed by the time interval Δt from the time at which the gate voltage Vg of the IGBT 11*a* is lowered down to the voltage V1 to the time at which the gate voltage Vg comes to maintain a voltage around the level of the ground GND, by which the off-holding transistor M2 is turned-on.

In this way, by the off-holding transistor M2 with a strong gate charge extraction capability turning-on with the delay of the specified time, the di/dt of the collector current Ic shown in FIG. 6 can be made to be smaller than the di/dt of the collector current Ic shown in FIG. 3, by which it becomes possible to suppress the peak of the voltage surge.

In addition, by the off-holding transistor M2, the gate voltage Vg of the IGBT 11*a* is maintained at a sufficiently low voltage level for making the IGBT 11*a* turned-off. Therefore, it becomes also possible to inhibit the malfunction of the IGBT 11*a*.

In the example shown in FIG. 6, the decision signal d1 as the output of the AND element IC1 is made to be delayed from the time at which the gate voltage Vg of the IGBT 11*a* is lowered down to the voltage V1 to the time at which the gate voltage Vg comes to maintain the voltage at the level of the ground GND. However, from the viewpoint of the collector current Ic, it is also said that the delay is provided from the time at which the gate voltage Vg of the IGBT 11*a* is lowered down to the voltage V1 to the time from which the collector current Ic flowing in the IGBT 11*a* comes to be maintained at 0 A.

As another way, the decision signal d1 as the output of the AND element IC1 may be made to be delayed from the time at which the gate voltage Vg of the IGBT 11*a* is lowered down to the voltage V1 to the time after the peak of the voltage surge produced in the IGBT 11*a*.

Namely, even though only the off-side transistor M1 is made turned-on first and the off-holding transistor M2 is then made turned-on after the peak of a voltage surge produced by the turning-on of the off-side transistor M1, the peak of the voltage surge is to become lower compared with the peak produced in the case shown in FIG. 3.

As was explained in the foregoing, according to the invention, the gate charge extraction capability of the off-side transistor and the gate charge extraction capability of the off-holding transistor can be fully exploited to make it possible to further suppress a voltage surge and inhibit malfunction in the semiconductor device.

In addition, the configuration in which only the control signal applied to the gate of the off-holding transistor is made delayed exerts no influence on the other control systems. Further, the configuration causes no increase in the circuit scale to make it possible to efficiently carry out the signal delay.

In the foregoing, the invention was explained with respect to an example of a configuration in which a semiconductor switch and a driving circuit are combined. The invention, however, can be implemented as a driving circuit applied to a semiconductor device with a configuration other than a semiconductor switch. Also in this case, the driving circuit according to the invention has the same effect.

In the foregoing, although the present invention was explained with respect to an embodiment thereof, the configuration shown in the embodiment can be substituted by other ones having similar functions. In addition, other arbitrary components and process steps may be added without departing from the spirit and scope of the present invention.

What is claimed is:

1. A semiconductor device, comprising:
   a semiconductor switch having a gate;
   a driving circuit configured to drive the semiconductor switch, and including a first transistor, connected to the gate of the semiconductor switch, configured to be turned-on at turning-off of the semiconductor switch in response to a first control signal, to extract gate charges of the semiconductor switch with a first extraction force;
   a comparator, one input thereof being connected to the gate of the semiconductor switch, configured to compare gate voltage of the semiconductor switch with a threshold voltage, and upon deciding that the gate voltage is lowered to a level below the threshold voltage, to output a first decision signal;
   an AND circuit, two inputs thereof being respectively connected to a gate of the first transistor and an output of the comparator, configured to perform an AND operation on a gate voltage of the first transistor and the first decision signal, to thereby output a second decision signal;
   a delay circuit, an input thereof being connected to an output of the AND circuit, configured to delay the second decision signal to thereby output the second decision signal with a delay of a predetermined time; and
   a second transistor, a gate thereof being connected to an output of the delay circuit and an output thereof being connected to the gate of the semiconductor switch, configured to be turned-on, in response to the output of the delay circuit, the predetermined time after the first transistor is turned-on, to thereby extract the gate charges of the semiconductor switch with a second extraction force larger than the first extraction force, wherein
   the delay circuit includes a resistor and a capacitor, which determine a length of the predetermined time.

2. The semiconductor device as claimed in claim 1, wherein the predetermined time is set so that a rate of change in a collector current of the semiconductor switch when the second transistor is turned-on by the output of the delay circuit is smaller than a comparative value,
   wherein the comparative value equals to a rate of change in a collector current of a comparative semiconductor device,
      which includes a semiconductor switch, a driving circuit, a comparator, an AND circuit and a second transistor respectively identical to those of the semiconductor device, but in which an input of the second transistor is connected directly to the output of the AND circuit and the second transistor is therefore turned-on directly by the second decision signal.

3. The semiconductor device as claimed in claim 1, wherein the delay circuit is configured to cause the second decision signal to delay from a time at which the gate voltage of the semiconductor switch is lowered to below the threshold voltage to a time from which the gate voltage comes to be maintained at the level of the ground.

4. The semiconductor device as claimed in claim 1, wherein the delay circuit is configured to cause the second decision signal to delay from a time at which the gate voltage of the semiconductor switch is lowered to below the threshold voltage to a time from which a collector current in the semiconductor switch comes to be maintained at zero.

5. The semiconductor device as claimed in claim 1, wherein the delay circuit is configured to cause the second decision signal to delay from a time at which the gate voltage of the semiconductor switch is lowered to below the threshold voltage level to a time after a peak of a voltage surge produced in the semiconductor switch.

6. A semiconductor device forming a driving circuit for driving a semiconductor switch, the device comprising:
a first transistor connected to a gate of the semiconductor switch, and configured to be turned-on at turning-off of the semiconductor switch in response to a first control signal, to thereby extract gate charges of the semiconductor switch with a first extraction force;
a comparator, one input thereof being connected to the gate of the semiconductor switch, configured to compare gate voltage of the semiconductor switch with a threshold voltage, and upon deciding that the gate voltage is lowered to a level below the threshold voltage, to output a first decision signal;
an AND circuit, two inputs thereof being respectively connected to a gate of the first transistor and an output of the comparator, configured to perform an AND operation on a gate voltage of the first transistor and the first decision signal, to thereby output a second decision signal;
a delay circuit, an input thereof being connected to an output of the AND circuit, configured to delay the second decision signal to thereby output the second decision signal with a delay of a predetermined time; and
a second transistor, a gate thereof being connected to an output of the delay circuit and an output thereof being connected to the gate of the semiconductor switch, configured to be turned-on, in response to the output of the delay circuit, the predetermined time after the first transistor is turned-on, to thereby extract the gate charges of the semiconductor switch with a second extraction force larger than the first extraction force, wherein
the delay circuit includes a resistor and a capacitor, which determine a length of the predetermined time.

7. The semiconductor device as claimed in claim 6, wherein the predetermined time is set so that a rate of change in a collector current of the semiconductor switch when the second transistor is turned-on by the output of the delay circuit is smaller than a comparative value,
wherein the comparative value equals to a rate of change in the collector current of the semiconductor switch driven by a comparative driving circuit, which includes a first transistor, a comparator, an AND circuit and a second transistor respectively identical to those of the semiconductor device, but
in which an input of the second transistor is connected directly to the output of the AND circuit and the second transistor is therefore turned-on directly by the second decision signal.

8. The semiconductor device as claimed in claim 7, wherein the delay circuit is configured to cause the second decision signal to delay from a time at which the gate voltage of the semiconductor switch is lowered to below the threshold voltage to a time from which the gate voltage comes to be maintained at the level of the ground.

9. The semiconductor device as claimed in claim 7, wherein the delay circuit is configured to cause the second decision signal to delay from a time at which the gate voltage of the semiconductor switch is lowered to below the threshold voltage to a time from which a collector current in the semiconductor switch comes to be maintained at zero.

10. The semiconductor device as claimed in claim 7, wherein the delay circuit is configured to cause the second decision signal to delay from a time at which the gate voltage of the semiconductor switch is lowered to below the threshold voltage level to a time after a peak of a voltage surge produced in the semiconductor switch.

11. The semiconductor device as claimed in claim 6, wherein the delay circuit is configured to cause the second decision signal to delay from a time at which the gate voltage of the semiconductor switch is lowered to below the threshold voltage to a time from which the gate voltage comes to be maintained at the level of the ground.

12. The semiconductor device as claimed in claim 6, wherein the delay circuit is configured to cause the second decision signal to delay from a time at which the gate voltage of the semiconductor switch is lowered to below the threshold voltage to a time from which a collector current in the semiconductor switch comes to be maintained at zero.

13. The semiconductor device as claimed in claim 6, wherein the delay circuit is configured to cause the second decision signal to delay from a time at which the gate voltage of the semiconductor switch is lowered to below the threshold voltage level to a time after a peak of a voltage surge produced in the semiconductor switch.

14. A control method of a semiconductor device for controlling a gate voltage of a semiconductor switch, the semiconductor device including a first transistor connected to a gate of the semiconductor switch, a comparator, one input thereof being connected to the gate of the semiconductor switch, an AND circuit, two inputs thereof being respectively connected to a gate of the first transistor and an output of the comparator, a delay circuit, an input thereof being connected to an output of the AND circuit, and a second transistor, a gate thereof being connected to an output of the delay circuit, and an output thereof being connected to the gate of the semiconductor switch, the method comprising the steps of:
turning-on the first transistor at turning-off of the semiconductor switch in response to a first control signal, to thereby extract gate charges of the semiconductor switch with a first extraction force of the first transistor;
comparing the gate voltage of the semiconductor switch with a threshold voltage by the comparator, and upon the comparator deciding that the gate voltage is lowered to a level below the threshold voltage, outputting a first decision signal from the comparator;

carrying out an AND operation by the AND circuit with a gate voltage of the first transistor and the first decision signal, and outputting a second decision signal from the AND circuit;

delaying the second decision signal by the delay circuit, and outputting the second decision signal with a delay of a predetermined time; and turning-on the second transistor, in response to the output of the delay circuit, the predetermined time after the first transistor is turned-on, to thereby extract the gate charges of the semiconductor switch with a second extraction force of the second transistor larger than the first extraction force, wherein the delay circuit includes a resistor and a capacitor, and a length of the predetermined time is determined by the resistor and the capacitor.

15. A control method of a semiconductor device for controlling a gate voltage of a semiconductor switch, the method comprising:

extracting gate charges of the semiconductor switch with a first extraction force by a first transistor, which is configured to be turned-on at turning-off of the semiconductor switch in response to a first control signal;

comparing the gate voltage of the semiconductor switch with a threshold voltage by a comparator, and upon deciding that the gate voltage is lowered to a level below the threshold voltage, outputting a first decision signal from the comparator;

carrying out an AND operation by an AND circuit with the gate voltage of the first transistor and the first decision signal, and outputting a second decision signal from the AND circuit;

delaying the second decision signal to thereby output the second decision signal with a delay of a predetermined time using a delay circuit; and extracting the gate charges of the semiconductor switch with a second extraction force larger than the first extraction force by a second transistor, which is configured to be turned-on after the first transistor is made to be turned-on in response to the output of the delay circuit, wherein the delay circuit includes a resistor and a capacitor, and a length of the predetermined time is determined by the resistor and the capacitor.

* * * * *